(12) United States Patent
Val (10) Patent No.: US 8,716,036 B2
(45) Date of Patent: May 6, 2014

(54) METHOD FOR COLLECTIVE FABRICATION OF 3D ELECTRONIC MODULES COMPRISING ONLY VALIDATED PCBS

(71) Applicant: 3D Plus, Buc (FR)

(72) Inventor: Christian Val, St Remy les Chevreuse (FR)

(73) Assignee: 3D Plus, Buc (FR)

( * ) Notice: Subject to any disclaimer, the term of this patent is extended or adjusted under 35 U.S.C. 154(b) by 0 days.

(21) Appl. No.: 13/730,047

(22) Filed: Dec. 28, 2012

(65) Prior Publication Data

US 2013/0171752 A1    Jul. 4, 2013

(30) Foreign Application Priority Data

Dec. 29, 2011    (FR) .................................... 11 04146

(51) Int. Cl.
*H01L 21/00*    (2006.01)

(52) U.S. Cl.
USPC .................................. 438/4; 438/17; 438/18

(58) Field of Classification Search
USPC ................... 438/14–18, 460–464, 4
See application file for complete search history.

(56) References Cited

U.S. PATENT DOCUMENTS

| | | | |
|---|---|---|---|
| 2007/0045875 A1* | 3/2007 | Farnworth et al. | 257/787 |
| 2007/0117369 A1* | 5/2007 | Val et al. | 438/618 |
| 2008/0308921 A1 | 12/2008 | Kim | |
| 2009/0039526 A1 | 2/2009 | Wang et al. | |
| 2009/0260228 A1 | 10/2009 | Val | |
| 2010/0261311 A1 | 10/2010 | Tsuji | |

FOREIGN PATENT DOCUMENTS

| | | |
|---|---|---|
| EP | 2053646 A1 | 4/2009 |
| FR | 2857157 A1 | 1/2005 |

* cited by examiner

*Primary Examiner* — Richard Booth
(74) *Attorney, Agent, or Firm* — Baker Hostetler LLP (57) ABSTRACT

A method for collective fabrication of 3D electronic modules comprises: the fabrication of a stack of reconstructed wafers, comprising validated active components, this stack including a redistribution layer; the fabrication of a panel of validated passive printed circuits which comprises: fabrication of a panel of printed circuits, electrical testing of each printed circuit, fitting of the validated printed circuits to an adhesive substrate, molding of the mounted circuits in an electrically insulating resin, called coating resin and polymerization of the resin, removal of the adhesive substrate, a panel comprising only validated printed circuits being thus obtained; bonding the panel with a stack (of reconstructed wafers); cutting the "stack of panel" assembly for the purpose of obtaining the 3D electronic modules.

6 Claims, 7 Drawing Sheets

METHOD FOR COLLECTIVE FABRICATION OF 3D ELECTRONIC MODULES COMPRISING ONLY VALIDATED PCBS

CROSS-REFERENCE TO RELATED APPLICATION

This application claims priority to foreign French patent application No. FR 1104146, filed on Dec. 29, 2011, the disclosure of which is incorporated by reference in its entirety.

FIELD OF THE INVENTION

The field of the invention is that of the fabrication of 3D electronic modules.

BACKGROUND

Figure 1:
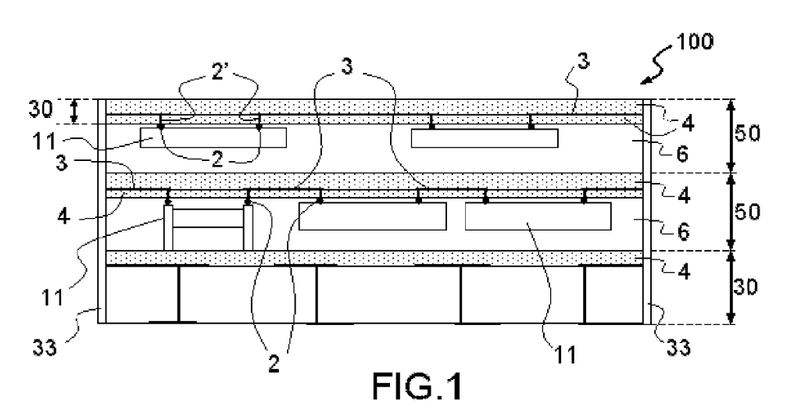
FIG. 1 already described represents schematically an example of a stack of slices of a 3D electronic module according to the prior art.

A 3D electronic module, an example of which is shown in FIG. 1, comprises a stack 100 of electronic slices 50 that are interconnected in three dimensions by using notably the faces of the stack to produce the connections between the slices. One slice 50 usually comprises one or more active and/or passive components 11 that have electrical connection elements 2, the components being coated in an electrically insulating resin 6. The connection elements 2 of the components are connected to connection pins 2' supported by an electrically insulating substrate 4. One or more electrically conductive tracks 3 supported by the insulating substrate 4 connect these components together or connect them to elements for electrically connecting the slices together. A 3D electronic module comprises at least one active component in one of the slices.

These slices 50 have preferably been obtained by collective fabrication from reconstructed wafers also called KGRWs which stands for Known Good Reconstructed Wafers, themselves made during the following steps:
A) Position and fasten to a substrate bare (=not encapsulated) active and/or passive silicon components 11 furnished with their connection pins 2, these components preferably having already been validated after a test; the connection pins are in contact with the substrate. This substrate is typically an adhesive sheet of the sticky skin type.
B) Place on the components and substrate assembly a polymer layer such as the epoxy resin 6.
C) Remove the substrate (the sticky skin),
D) Redistribute the pins to connect all of the components 11 of one and the same pattern and/or make connections to the periphery of the pattern for the purpose of a subsequent 3D interconnection. For this purpose, a layer of an insulating material 4 of the etchable polymer type on which metal conductive tracks 3 are formed providing the connection of the component 11 to other components and/or to the periphery is placed. An insulating layer 4 is optionally placed on the conductive tracks 3. In certain cases of complex connections, several insulator+metal+optional insulator (=level) layers can be placed on one another. This has produced a redistribution layer 30 called RDL layer with one or more levels. In the figure, the RDL layer of each slice 50 has a single level.
This has produced a "KGRW" reconstructed wafer which therefore comprises only previously tested and validated slices.
E) When several KGRW wafers have been fabricated they are then stacked.
F) A pin redistribution layer 30, called RDL for ReDistribution Layer, is formed on one of the faces of the stack, thus forming the "first" layer of the stack. This RDL layer typically comprises 1 to 4 levels (or sublayers) and is formed on the stack of wafers before the cutting step, that is to say during the collective fabrication method. In the figure it has two levels.

The stack of wafers is cut to obtain stacks 100 of slices.

Conductors 33 situated on the lateral faces of the stack of slices, that is to say on the edges of the slices and optionally on one of the faces, and called lateral conductors, are formed to electrically connect the components of one slice to the other.

An example of such a method is described in patent FR 2 857 157.

However it is often necessary to have, for one slice 50 and/or for the first layer of the stack 100 of slices, a redistribution layer (RDL) of more than 4 levels: 6 to 10 connection levels are often necessary. But the yield of the RDL layers falls rapidly with the increase in the number of levels. For one slice, it falls typically from an yield of 96% with an RDL with one level to 80% for an RDL with four levels; RDLs with 6 levels or more are therefore not produced.

As a consequence, there now remains a need for a method for collective fabrication of 3D electronic modules that simultaneously satisfies all the aforementioned requirements in terms of number of redistribution layers and of yield (number validated/number fabricated).

SUMMARY OF THE INVENTION

The principle of the invention is:
on the one hand to provide the electrical connection between the stacked slices of a 3D electronic module (the stacks being obtained using the techniques of the semiconductor industry), by a printed circuit or PCB for Printed Circuit Board, which makes it possible to have more connection layers, and
on the other hand to obtain the 3D electronic modules by collective fabrication by using a panel of PCBs that are 100% good, which makes it possible to increase the overall yield of fabrication.

The subject of the invention is a method for the collective fabrication of 3D electronic modules which comprises:
one step of fabricating a stack of N reconstructed wafers (N≥1) called KGRWs each comprising only identical patterns validated after a test, one pattern comprising at least one active and/or passive silicon component, at least one reconstructed wafer comprising active components, this stack including a redistribution layer with a maximum of 4 interconnection levels,
characterized in that it comprises:
a step of fabricating a panel of identical passive printed circuits comprising only passive printed circuits comprising at least 6 interconnection levels and validated after a test, which comprises the following sub-steps:
fabrication of a panel of identical printed circuits,
electrical testing of each printed circuit,
fitting of the validated printed circuits after this test to an adhesive substrate,
moulding of the mounted circuits in an electrically insulating resin of the epoxy type, called coating resin and polymerization of the resin,
removal of the adhesive substrate, a panel comprising only validated printed circuits, called a panel of KGRPs, being thus obtained after this step, a step of bonding the panel of KGRPs with a stack of KGRWs, in order to form a "stack of KGRWs-KGRP panel" assembly, a step of cutting the "stack of KGRWs-KGRP panel" assembly along cutting lines for the purpose of obtaining the 3D electronic modules.

According to one feature of the invention, it comprises, between the bonding step and the cutting step, a step of producing a redistribution layer with a thickness of less than 30 μm, on the panel of KRGPs.

The cutting lines are preferably on the coating resin.

Since the "stack of KGRWs-KGRP panel" assembly comprises in its thickness at least one electrically insulating zone, it optionally comprises between the step of bonding the KRGP and the cutting step a step of piercing holes in the said electrically insulating zone(s), and a step of filling these holes with an electrically conductive material.

Several stacks of KGRWs and/or several KGRP panels can be fabricated: before the cutting step, the step of bonding a stack of KGRWs with a panel of KGRPs is thus reiterated, the "stack of KGRWs-KGRPs panel" assembly comprising several stacks of KGRWs and/or several panels of KGRPs.

BRIEF DESCRIPTION OF THE DRAWINGS

Other features and advantages of the invention will become clear after reading the following detailed description made as a non-limiting example and with reference to the appended drawings in which.

From one figure to another, the same elements are indicated by the same references.

DETAILED DESCRIPTION

Figure 4A:
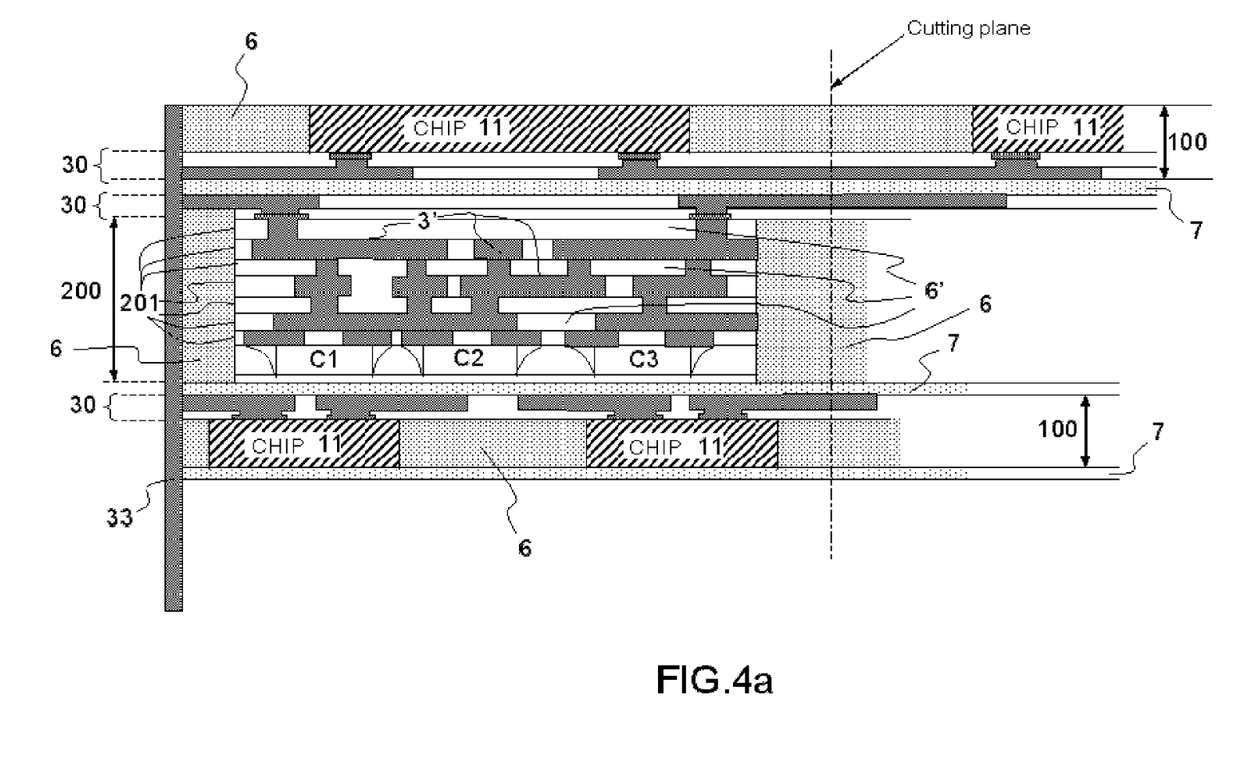
FIGS. 4a-4b represent schematically two examples of 3D electronic modules according to the invention, one having been cut with the same resin structure along the cut (FIG. 4a), the other with two different resin structures (FIG. 4b)
Figure 4B:
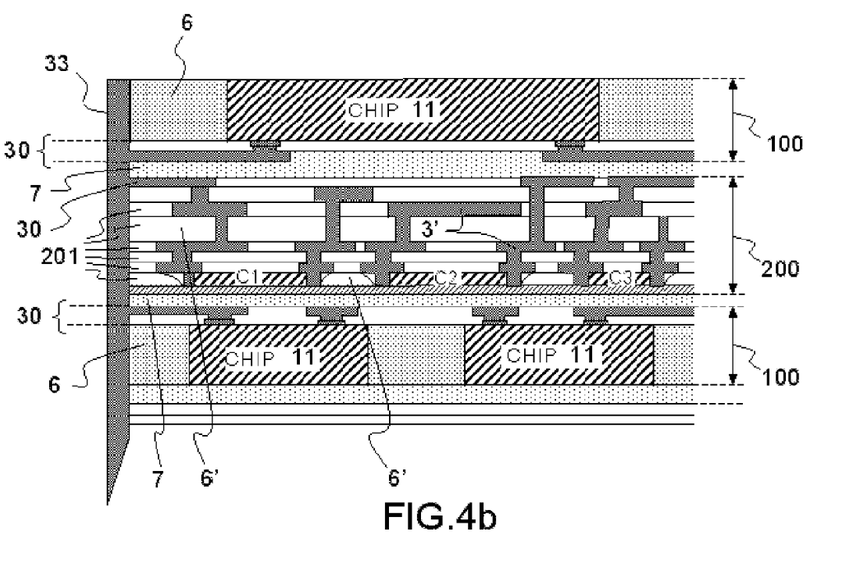

A 3D electronic module according to the invention of which an example is shown in FIGS. 4a and 4b comprises at least:

one stack of N slices 50 (N 1); this stack comprising at least one active component is called the active stack 100 and includes an RDL layer 30 on one face (or on both faces) of the stack, and a printed circuit or PCB 200 providing the electrical connection between the components of these slices, this PCB comprising at least 6 interconnection levels being itself stacked on the said stack 100.

The thicknesses in the figures are not to scale.

A PCB may also be designed to provide the connection between two active stacks placed one on one face of the PCB, the other on the other face, as can be seen in the example of a 3D electronic module in FIG. 4 where only one slice 50 of each active stack is shown. More generally, a 3D electronic module according to the invention comprises one or more active stacks and one or more PCBs.

As indicated in the preamble, the 3D electronic modules (without the lateral conductors) are obtained after a step of cutting the stacked wafers, the stack including a first layer, an RDL layer approximately 30 μm thick. It is considered that the stack of the KGRW wafers has been produced by using the technologies used in the semiconductor industry, according to a collective fabrication method as specified in the preamble and comprising the successive steps A, B, C, D, E and F.

The current concern is the collective fabrication of printed circuits or PCBs.

It should be noted that a printed circuit or a PCB for a Printed Circuit Board is an electrical connection circuit that comprises electrically conductive tracks and may comprise passive components such as capacitors C, resistors R and self inductors. A PCB typically comprises 50 to 150 bypass capacitors which will be respectively connected to the active components (also called chips) and/or passive components of the active stack.

Figure 2A:
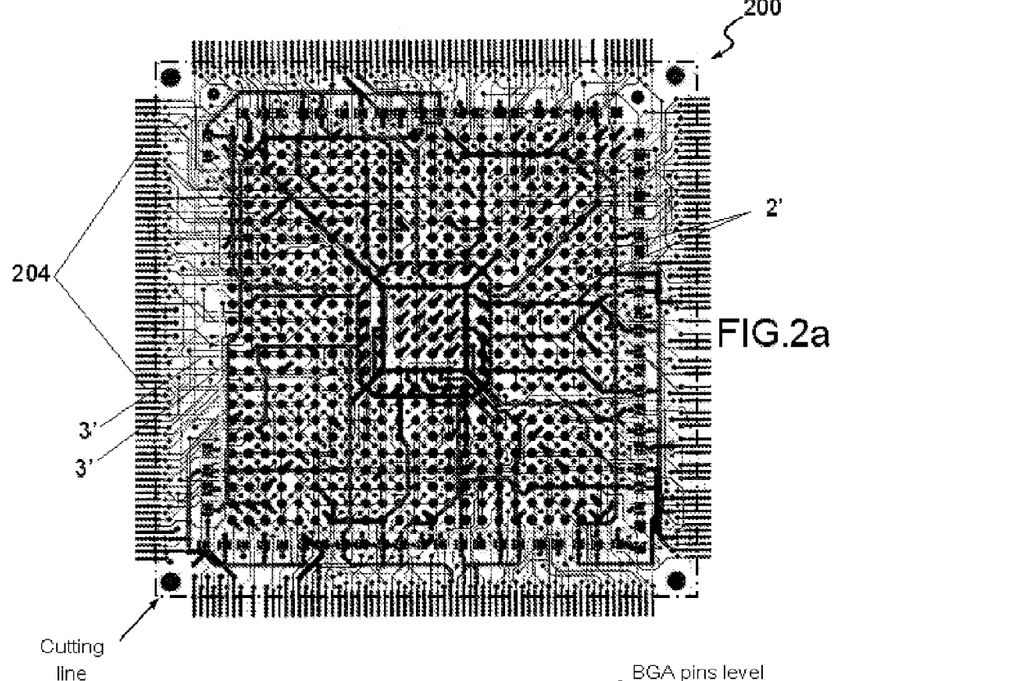
FIGS. 2a-2b represent schematically an example of a PCB according to the prior art, seen from above (FIG. 2a) and in section (FIG. 2b)
Figure 2B:
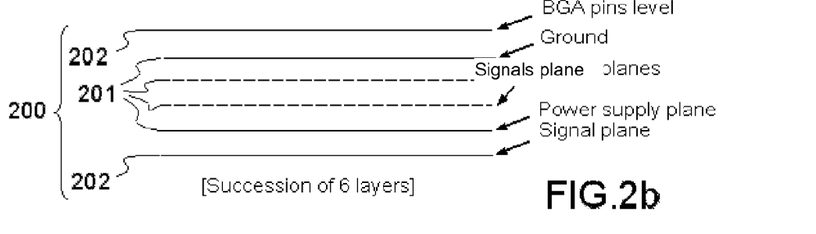

These PCBs 200 normally have more than 6 levels (or layers) as shown in FIG. 2b, (with 4 levels so as not to overcomplicate the figure), because they are also provided with ground planes and the isopotential power supply for each necessary voltage, each plane forming one level.

Note that a PCB consists:
of internal layers 201 reserved for the ground and power supply planes and optionally comprising signal-routing planes, the superposition of which forms a panel of internal layers,
and usually of external layers 202 providing the routing for the signals, sandwiching this panel of internal layers, once the latter is produced.

Figure 7:
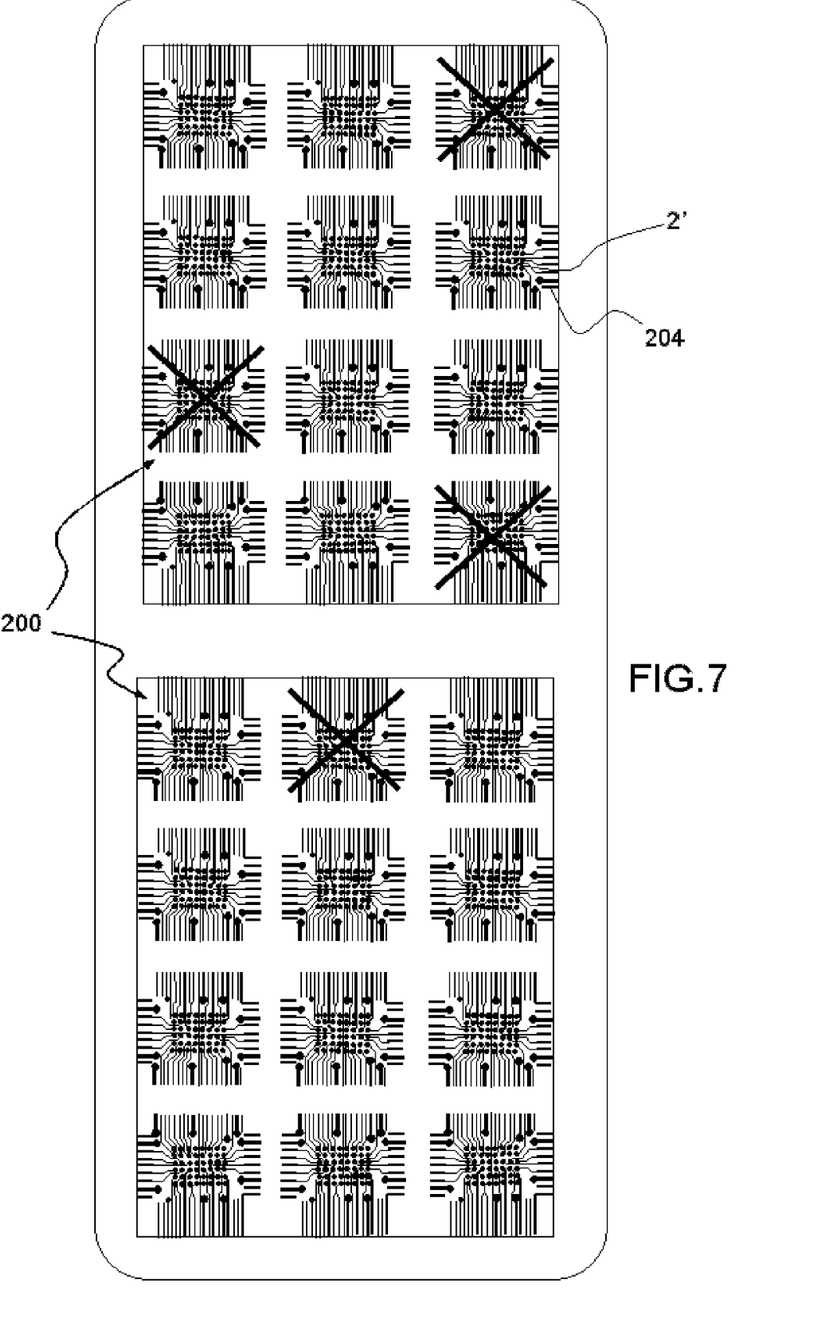
FIG. 7 shows an example of a panel in two parts of PCBs, with 4 PCBs considered faulty.

The yield of the panel of internal layers is between 90% and 95% because only layers selected after being tested and validated are pressed between them to form this panel. But the yield of the external layers that are constructed one by one on the panel of internal layers depending on the required thinness of etching, may vary between 75% and 90%. The overall yield that is the product of the unitary yields is therefore between 70% and 85%. An example of a panel (in two parts) of PCBs 200 is shown in FIG. 7: 4 PCBs have been considered faulty, hence a yield of 83%.

Thus, for the collective fabrication of 3D modules, the benefit associated with the use of KGRWs for the active stack with a yield close to 100% may be lost when these KGRWs are stacked on a panel of PCBs of which some are faulty. This is all the more concerning if the value of the active components is much higher than that of the passive elements (the PCBs). That is why, according to the invention, a panel will be produced that comprises only good PCBs, that is to say that comprises only PCBs that have been validated after a test, and designated KGRPs that stands for "Known Good Reconstructed PCBs".

The prior step consists in producing in conventional manner a panel of PCBs comprising n identical patterns (or PCBs), n typically varying from 20 to 1000 depending on the format of the panels and of the patterns. For the fabrication of this panel, the usual techniques for fabricating printed circuits are used, that is to say the photoetching of a layer made of copper previously deposited on an electrically insulating substrate 6' made of epoxy resin; the making of printed circuits never requires the use of silicon. This copper layer is laminated and then placed by pressing onto the substrate, which requires a minimal thickness both for the copper layer and for the substrate. The thickness of the copper is usually 5 μm to 25 μm which limits the definition of the etching of the tracks 3'. Specifically, the greater the thickness of a layer that is to be chemically etched, the worse the definition because of a sub-etching phenomenon. In practice, pitches greater than 100 μm, typically between 100 μm and 200 μm, are obtained for the conductors 3'. Note that a pitch is the total of the width of a conductor and the space between two conductors 3'. A pitch of 100 μm=50 μm (width of conductor)+50 μm (space between two conductors). The thickness of the substrate 6' varies between 50 μm and 150 μm.

To reduce the expansion coefficient of the epoxy resin forming the substrate 6', the latter contains glass fibres; it is in this way that this coefficient increases from 60 to 80 ppm/° C. for the resin only to 15 to 18 ppm/° C. with glass fibres in the resin. On the other hand, the "Z" expansion coefficient will remain unchanged and will be between 60 and 80 ppm/° C.

The masks used for the insulation are made of flat glass because of the flatness requirements.

This therefore gives a minimal thickness of 75 μm per connection level (50 μm for the substrate+25 μm for the copper tracks). The levels are made one on top of the other to finally form a panel of PCBs of at least 750 μm thick for a PCB with 10 levels.

Although, with the photoetching technologies used to produce KGRWs, the substrate 6 made of microbead-laden resin that is deposited in liquid form typically has, after polymerization, a thickness of between 10 μm and 15 μm and the metal tracks have a thickness of the order of 1 μm or even less which makes it possible to obtain pitches of less than 10 μm.

Each pattern, that is to say each PCB, is then tested electrically, and then the panel is cut.

Figure 3A:
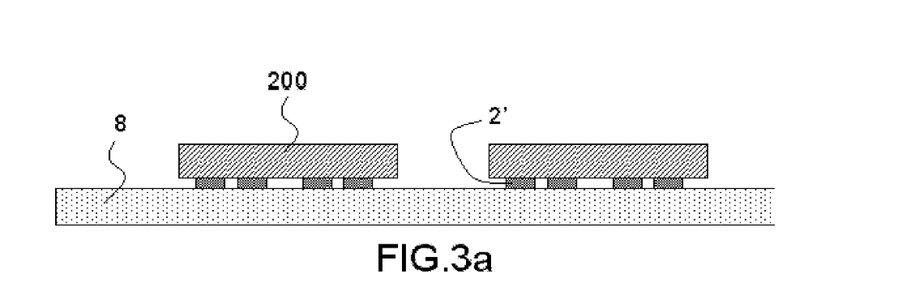
FIGS. 3a-3f illustrate the various steps for collective fabrication of 3D electronic modules according to the invention.

During a subsequent step (step a, FIG. 3a), the PCBs 200 that have been validated after the test are mounted to an adhesive substrate 8 for example by a method of the <<pick and place>> type, the interconnection pins of each PCB being on the side of the adhesive substrate as shown in the figure. This adhesive substrate may be an adhesive sheet for example like a sheet of polyvinyl chloride, usually called a drumskin or sticky skin with a thickness of approximately 25 μm and which can be unstuck without a particular treatment, by peeling for example.

During a step b (FIG. 3b), the PCBs 200 are then coated in an electrically insulating resin 6 of the same type as that used to produce the KGRWs (epoxy resin for example), which is then polymerized.

Figure 3B:
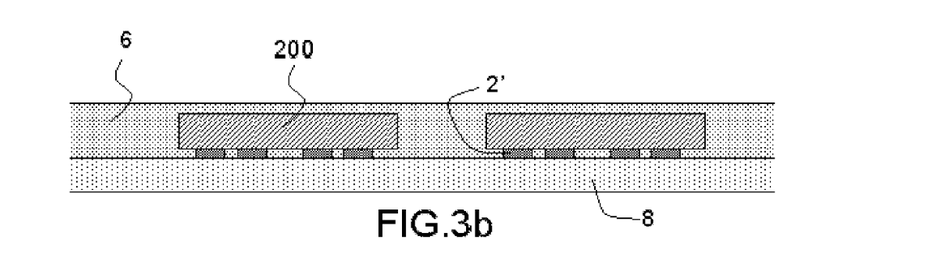

This resin 6 is laden with silicon beads which are used to reduce its X, Y and Z expansion coefficient (in the three spatial directions): it is isotropic, while the glass fibres that are present in the substrate 6' of the PCB make it possible to reduce the expansion coefficient of the substrate only in the X and Y directions, and also have disadvantages in terms of leakage currents, during the subsequent step of producing conductors 33 on the lateral faces of each 3D module as described below. In this case, the coating of the PCBs also has the usual function of fixing the position of each PCB on the sticky skin, an insulation function of the glass fibres of each layer at the future cutting lines, in order to reconstitute by construction a panel of PCBs that have, at these cutting lines, the same structure as the KGRWs onto which it will be stacked and thus prevent these leakage currents.

Once the PCBs have been coated, the sticky skin 8 is removed.

A panel has thus been produced comprising only validated PCBs, called a panel of KGRPs, that is to say a panel of which the yield is 100%.

An RDL 30 at one level is produced on the external face of the panel of PCBs (step c, FIG. 3c) to make the connections to the periphery of each PCB 200. This makes it possible to produce a highly precise layer by using this time the techniques used to fabricate the wafers; it is therefore possible to produce on the surface of the provisional panel conductive tracks with a small pitch, that is to say less than 100 μm. A pitch of 10 μm can be envisaged with these techniques. This makes it possible to improve the intrinsic yield of the panel of KGRPs thus obtained.

This panel of KGRPs provided with an RDL is then itself bonded to the stack of KGRW wafers (FIG. 3d) by means of a preferably liquid adhesive 7, for example of the epoxy type.

Figure 3C:
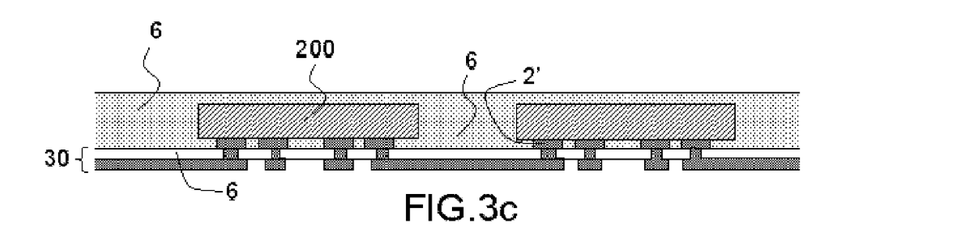
Figure 3D:
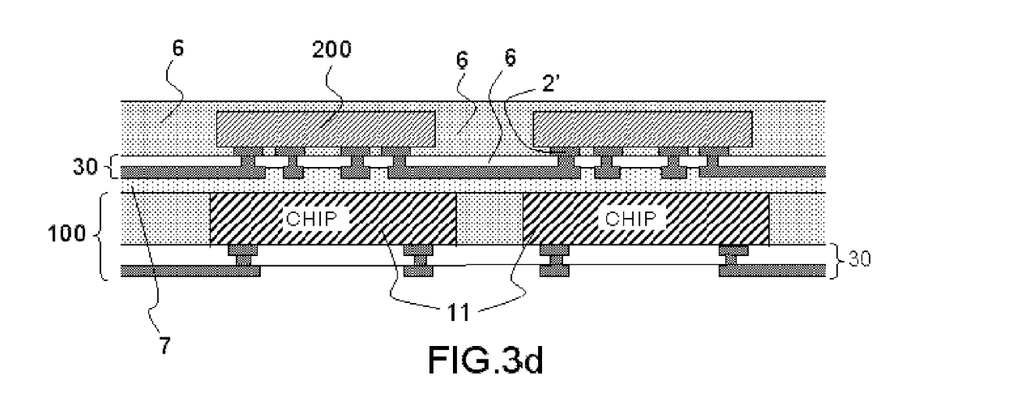

Preferably, according to a variant, the external layers 202 are not constructed during the fabrication of the original PCB panel (previous step) which therefore comprises only the internal layers 201. A provisional panel of KGRPs comprising only good patterns is reconstituted as indicated above. The external layers 202 are then replaced by the production of an RDL layer (optionally with several layers) on the surface of the provisional panel of KGRPs (step c), this RDL 30 being produced as indicated above. This makes it possible to improve the intrinsic yield of the panel of KGRPs thus obtained.

This panel of KGRPs furnished with an RDL layer is then itself bonded to a stack 100 of KGRW wafers (step d, FIG. 3d) by means of a preferably liquid adhesive 7, for example of the epoxy type, and thus forms a "stack of KGRWs-panel of PCBs" assembly.

Optionally, another stack of KGRWs is bonded to the KGRP panel, the latter then being between two stacks of KGRWs. More generally a "stack of KGRWs-panel of PCBs" assembly may comprise several stacks of KGRWs and/or several panels of KGRPs, successively bonded to one another, as in the example of FIG. 4a.

Figure 3E:
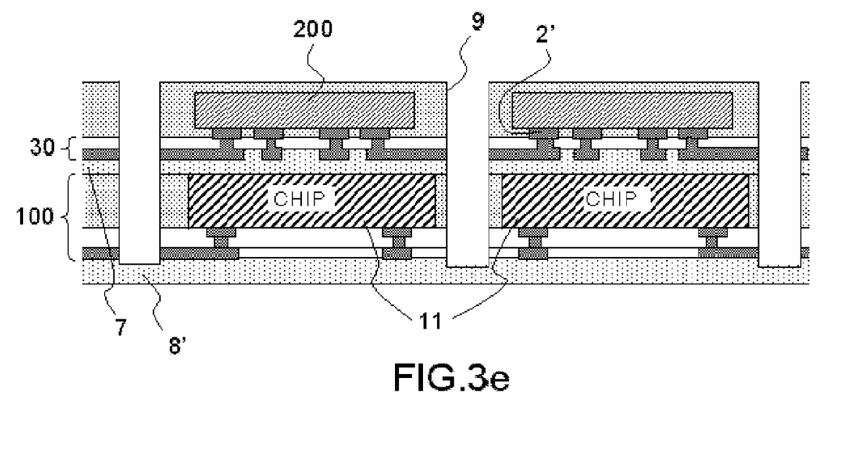
Figure 3F:
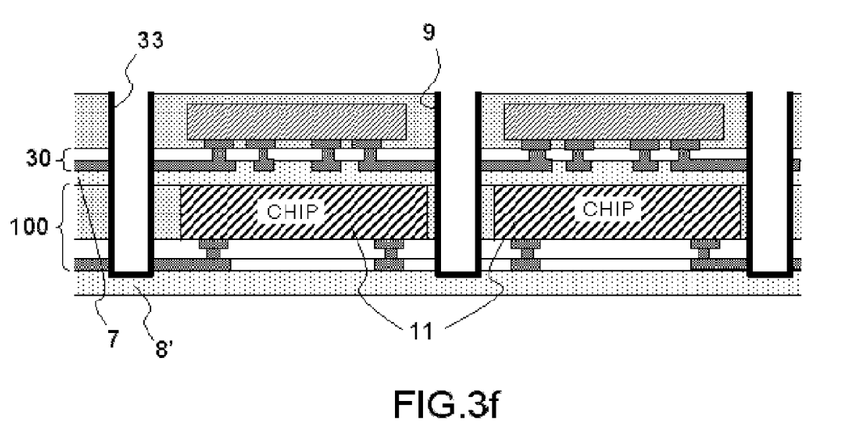

The future 3D modules are cut (step e, FIG. 3e) along vertical cutting lines 9 (in the direction of the stack) then the lateral conductors 33 are formed on the lateral faces (step f, FIG. 3f). Preferably, before the cutting step, a sticky skin 8' is placed under the "stack of KGRWs-panel of PCBs" assembly so as to be able to collectively carry out the metallization step of the future lateral faces (step f). This sticky skin is removed to obtain the 3D modules.

When the cutting lines 9 traverse the glass-fibre resin 6' (as can be seen in the example of FIG. 4b), the sections of these fibres appear on the lateral faces of the 3D electronic module before the production of the lateral conductors. At the time of the chemical metallization to produce these lateral conductors 33, there is then a slight penetration of the metallization along these fibres which leads to leakage currents after etching. The behaviour of the silicon bead-laden resins 6 does not have this drawback since there is no continuity between the microbeads. By offsetting the cutting lines 9 to the level of the coating resin 6, the sections of these fibres do not appear on the lateral faces of the 3D electronic module before production of the lateral conductors as shown in FIG. 4a.

There are several categories of PCBs, some of them being able favourably to take advantage of this variant:

PCB for external connection. An example of the routing of such a 6-layer PCB (there could easily be 10 of them) is shown in FIG. 2a. Seen in the central portion are matrix pins 2' designed to receive the solder beads of an active component. The 4 sides support the conductors that are perpendicular to each of them and that, after stacking of the various layers, will be cut along the cutting line: these conductors then have the reference 204. These conductors have pitches of between 100 μm and 200 μm for example. Since the production of pitches smaller than 100 μm is not currently feasible industrially with an acceptable yield, the production of an RDL layer according to the variant is of great value.

Figure 5:
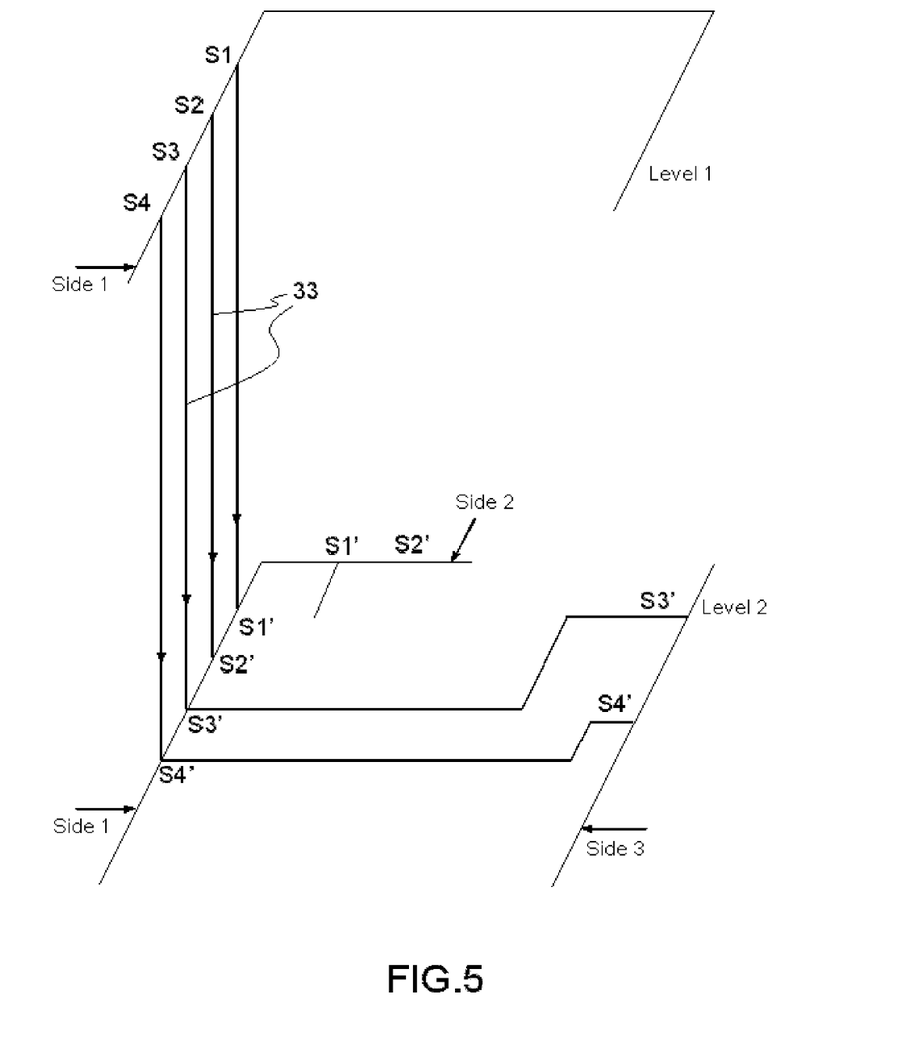
FIG. 5 represents a topological example of a PCB seen in exploded manner, according to the prior art.

Topological PCB which is used to bring an interconnection exiting on 1 or 2 sides for one level 1, to an interconnection exiting on other sides for another level 2 for example. FIG. 5 shows an example of interconnection of the level 1 having outputs S1 to S4 on one side, with the level 2 that redistributes these outputs on two sides: the outputs 51' and S2' are redistributed on the side 2, and the outputs S3' and S4' are redistributed on the side 3.

Figure 6:
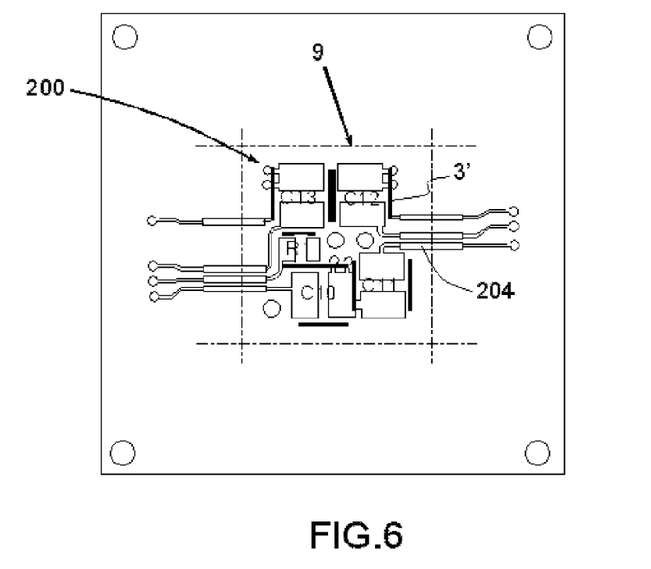
FIG. 6 represents an example of a PCB with surface-mounted passive components, according to the prior art.

PCB with passive components (capacitors and/or resistors and/or self inductors) usually made of ceramic, surface mounted. FIG. 6 shows an example of a PCB seen from above with 5 mounted passive components: one resistor R and 4 capacitors C. In this example, the pitch of the conductors 3' and 204 is large. It can greatly diminish with a larger density of passive components such as for example 200 capacitors in the case of a bypass of an FPGA (Field Programmable Gate Array) chip for which isopotential ground and power supply planes will be necessary to power these capacitors, the lateral outputs or the outputs via through-holes (TPV standing for "Through Polymer Vias") then requiring an RDL level.

PCB with ceramic passive components buried in this PCB. This situation is identical to the previous one but with passive components buried in the PCB. An RDL layer is used to replace the conductors on the sides (or the through-holes) of each pattern.

Irrespective of the PCB category, the latter comprise no silicon.

Certain active stacks that comprise fast processors or processors with a large number of inputs-outputs, or else fast memories with a large bus, require several power supply voltages and a distribution of electrical currents that is virtually without inductance so as not to delay the establishment of the appropriate voltage level.

An existing solution consists in producing through-holes or TSVs for "Through Silicium Vias" in the chips and in interconnecting them vertically, this vertical path being shorter than the one passing through the sides of the 3D module. However, the problem of the power supplies with the appropriate bypass requires the use of capacitors as close as possible to the chips.

According to the invention, the panel of KGRPs is placed on the stack of KGRWs so that the RDL of the stack of KGRWs faces the RDL of the panel of PCBs. It is also possible to proceed in the following manner. After the bonding step and before the cutting step, holes passing through the "stack of KGRWs-KGRP panel" assembly are pierced in the resin and filled with an electrically conductive material such as copper by using PCB techniques. This makes it possible to connect the power supply plane in the PCB and the power supply pin of the chip through TPVs, which leads to a distance of between 75 μm et 200 μm which remains very small. This assembly connected in this way can itself be stacked on other stacks of KGRWs and/or other panels of PCBs before being cut. The interconnection via the lateral conductors 33 is then reserved for the signals.

The invention claimed is:

1. A method for the collective fabrication of 3D electronic modules, comprising:
   fabricating a stack of N reconstructed wafers, where N≥1, being KGRWs, each comprising only identical patterns validated after an electrical test, one pattern comprising at least one active and/or passive silicon component, at least one reconstructed wafer comprising active components, this stack including a redistribution layer with a maximum of 4 interconnection levels;
   fabricating a panel of identical passive printed circuits comprising only passive printed circuits comprising at least 6 interconnection levels and validated after a test, which comprises:
      fabrication of a panel of identical printed circuits,
      electrical testing of each printed circuit,
      fitting of the validated printed circuits after this test to an adhesive substrate,
      moulding of the mounted circuits in an electrically insulating resin of the epoxy type, called coating resin and polymerization of the resin,
      and
      removal of the adhesive substrate, a panel comprising only validated printed circuits, being a panel of KGRPs, being thus obtained after this step;
   bonding the panel of KGRPs with a stack of KGRWs, in order to form a stack of KGRWs-KGRP panel assembly; and
   cutting the stack of KGRWs-KGRP panel assembly along cutting lines for the purpose of obtaining the 3D electronic modules.

2. The method for the collective fabrication of 3D electronic modules according to claim 1, further comprising, between the bonding step and the cutting step, producing a redistribution layer with a thickness of less than 30 μm, on the panel of KRGPs.

3. The method for collective fabrication of 3D electronic modules according to claim 2, wherein the cutting lines are on the coating resin.

4. The method for collective fabrication of 3D electronic modules according to claim 1, wherein since the stack of KGRWs-KGRP panel assembly comprises in its thickness at least one electrically insulating zone, it comprises between the bonding and the cutting, piercing holes in the said electrically insulating zone(s), and filling these holes with an electrically conductive material.

5. A method for collective fabrication of 3D electronic modules according to claim 1, wherein several stacks of KGRWs and/or several KGRP panels are fabricated and wherein before the cutting, the bonding a stack of KGRWs with a panel of KGRPs is reiterated, the stack of KGRWs-KGRPs panel assembly comprising several stacks of KGRWs and/or several panels of KGRPs.

6. The method for collective fabrication of 3D electronic modules according to claim 1, wherein a printed circuit comprises a resistor and/or a capacitor and/or a self inductor.

\* \* \* \* \*